United States Patent [19]

Takagi et al.

[11] 4,388,612
[45] Jun. 14, 1983

[54] SIGNAL CONVERTER

[75] Inventors: Katsuaki Takagi, Kokubunji; Yuzo Kita, Fuchu, both of Japan

[73] Assignee: Hitachi, Ltd., Tokyo, Japan

[21] Appl. No.: 287,824

[22] Filed: Jul. 28, 1981

[30] Foreign Application Priority Data

Jul. 28, 1980 [JP] Japan .................... 55-102531

[51] Int. Cl.³ .......................... H03K 13/02
[52] U.S. Cl. ................ 340/347 DA; 340/347 C
[58] Field of Search .......... 340/347 DA, 347 AD, 340/347 C

[56] References Cited

U.S. PATENT DOCUMENTS 4,200,863 4/1980 Hodges ................ 340/347 DA

OTHER PUBLICATIONS

Fotouhl, IEEE International Solid-State Circuits Conference, Feb. 15, 1979, pp. 186–187.

Primary Examiner—C. D. Miller
Attorney, Agent, or Firm—Antonelli, Terry & Wands

[57] ABSTRACT

An analog-to-digital converter includes a capacitor array circuit for determining m upper bits of a digital output, which includes a plurality of capacitors having binary-weighted capacitance ratios and a plurality of switches and which is connected to an input terminal of a sampled analog voltage and a reference voltage source. A resistor string circuit is provided for determining n lower bits of the digital output, including a plurality of switches and which is connected to the capacitor array circuit. A voltage comparator compares an output voltage of the capacitor array circuit with the ground potential and successive approximation registers successively provide pulses for controlling the switches of the capacitor array circuit and the resistor string circuit in accordance with the output of the voltage comparator. A circuit generates timing pulses for controlling the operation of the successive approximation registers. The resistor string circuit applies voltages equal to $i/2^n$ (where i denotes a value expressed by the n lower bits of the digital output) and $(2^n-i)/2^n$ of a reference voltage to the capacitor array circuit, and the capacitor array circuit operates so as to put the input analog signal into a digital signal in accordance with a linear input/output conversion characteristic.

26 Claims, 14 Drawing Figures

| $a_0$ | $a_1$ | $a_2$ | $a_3$ | $b_P$ | $b_0$ | $b_1$ | $b_2$ | $b_3$ |
|---|---|---|---|---|---|---|---|---|
| 1 | 1 | 1 | 1 | 1 | 0 | 0 | 0 | 0 |
| 1 | 1 | 1 | 0 | 0 | 0 | 0 | 0 | 1 |
| 1 | 1 | 0 | 1 | 0 | 0 | 0 | 1 | 1 |
| 1 | 1 | 0 | 0 | 0 | 0 | 0 | 0 | 1 |
| 1 | 0 | 1 | 1 | 0 | 0 | 1 | 1 | 1 |
| 1 | 0 | 1 | 0 | 0 | 0 | 0 | 0 | 1 |
| 1 | 0 | 0 | 1 | 0 | 0 | 0 | 1 | 1 |
| 1 | 0 | 0 | 0 | 0 | 0 | 0 | 0 | 1 |
| 0 | 1 | 1 | 1 | 0 | 1 | 1 | 1 | 1 |
| 0 | 1 | 1 | 0 | 0 | 0 | 0 | 0 | 1 |
| 0 | 1 | 0 | 1 | 0 | 0 | 0 | 1 | 1 |
| 0 | 1 | 0 | 0 | 0 | 0 | 0 | 0 | 1 |
| 0 | 0 | 1 | 1 | 0 | 0 | 1 | 1 | 1 |
| 0 | 0 | 1 | 0 | 0 | 0 | 0 | 0 | 0 |
| 0 | 0 | 0 | 1 | 0 | 0 | 0 | 1 | 1 |
| 0 | 0 | 0 | 0 | 0 | 0 | 0 | 0 | 1 |

SIGNAL CONVERTER

BACKGROUND OF THE INVENTION

This invention relates to a signal converter; and, more particularly, it relates to a digital-to-analog (D/A) converter which has a linear input/output characteristic and also to an analog-to-digital (A/D) converter of the successive approximation type which employs the D/A converter as a local decoder.

A linear D/A converter or A/D converter is an important constituent of the input/output circuit of each of various control systems which utilize digital data processors, for example, computers. Such a converter has heretofore been known in various forms.

One of the well-known converters of this sort is the weighted capacitance type converter, which uses an array consisting of a plurality of capacitors having binary-weighted capacitance ratios. In this case, the capacitors correspond to the respective bits of a binary word. The ends of the capacitors on one side are connected to a single signal line in common, while the other ends are selectively connected to a reference voltage supply line or a ground voltage supply line through respective switches. In this converter, the switched are turned "on" and "off" in conformity with the pattern of the binary word. The capacitors corresponding to the bits having the binary value "1" are connected to the reference voltage, and the other capacitors are connected to ground, whereby an analog voltage corresponding to a digital value is generated on the signal line.

Since capacitor elements can be formed on a semiconductor substrate at a comparatively-high relative accuracy by utilizing the technology used for producing MOS devices, the weighted capacitance type converter brings forth the advantage that a conversion characteristic of excellent linearity is attained. However, when it is intended to fabricate a converter of high resolution with this type of construction, there is the problem that the semiconductor substrate requires a large area in order to form a capacitor array having correct binary-weighted coefficients.

By way of example, the capacitor array of the correct binary-weighted coefficients may be fabricated in such a way that a large number of capacitor elements each having a unit capacitance are formed and that the capacitor elements in numbers corresponding to the weighted coefficients are combined to form the capacitors of the respective bits. With this measure, however $2^n$ unit capacitors are needed for a converter which has a resolution of n bits. On the other hand, when it is intended to form the capacitors of the respective bits in the shape of individual capacitor elements of unequal areas, it is necessary to make the size of the capacitor of the least-significant bit (LSB) large to some extent and to precisely determine the sizes of the other capacitors with reference to the first-mentioned size, in order to suppress within a prescribed range the errors of the capacitance ratios of the capacitors ascribable to manufacturing techniques. If it is intended to obtain the capacitor array of the binary-weighted coefficients with the capacitor of the LSB set at a small capacitance, it is feared that the binary coefficients will not become correct on account of the manufacturing errors and that the variation of analog values will become nonmonotonic versus the continuous increase of digital values in one direction. Such disorder of the monotonicity degrades the differential linearity of the A/D converter, and limits the usage thereof.

As another type of converter, there has been known the resistor string type. In the converter of this type, a reference voltage is equally divided by a resistor string so as to derive a divided voltage corresponding to a binary word. The selection of the divided voltage can be effected through a plurality of switches connected in the shape of a matrix as disclosed in, for example, Japanese Patent Application Laying-open No. 52-28851 (U.S. application Ser. No. 608,873).

The switching matrix disclosed in the laid-open specification has N current paths which are connected to protrusions of the resistor string, and each of which includes n switches fulfilling the relationship $N = 2^n$. The switches are turned "on" and "off" by control signals which correspond to the respective bits of the binary word.

With the resistor string type converter, one of the N voltages divided by the resistor string is selected in correspondence with the binary word, and hence, there is the advantage that the monotonic increase of analog output voltages versus the increase of digital values is ensured. However, the resistance values of resistor elements which are formed on a semiconductor substrate vary depending upon the shapes thereof or due to external pressures acting on the substrate. Therefore, even when it is intended to fabricate a converter of high resolution with this type of construction, it is difficult to form a resistor string of uniform resistance distribution, and a problem is posed in the linearity of the input/output characteristic.

A converter with the weighted capacitance type characteristics and the resistor string type characteristics combined has also been known in a coder and a decoder for PCM signals having nonlinear input/output conversion characteristics. For example, the IEEE Journal of Solid-State Circuits, Vol. SC-14, No. 1, February, 1979, pp. 65–73, has introduced a converter (CODEC) wherein a compressed quantizing characteristic of $\mu = 255$ is approximated by 15 chords (or segments) and wherein eight segments of each of the plus and minus polarities are determined by a capacitor array, while sixteen steps within each segment are determined by a resistor string. In this case, the capacitor array consists of eight capacitors having binary-weighted capacitance ratios (coefficients). The capacitors from that of the smallest coefficient to that of a coefficient value which is assigned by the upper three bits of a binary word except the sign bit thereof are supplied with a reference voltage, the capacitor of the upper bit adjoining the capacitor of the assigned coefficient value is supplied with a divided voltage which corresponds to the lower four bits of the binary word and which is obtained from the resistor string, and the other capacitors are supplied with ground potential.

When, in the construction of the CODEC, the capacitors of the capacitor array are made to have equal capacitances, a linear quantizing characteristic can be attained. With this construction, however, that number of capacitors which is equal to the number of segments are required, and a converter in which the upper n bits of the binary word are allotted to the segment assignment needs as many as $2^n$ capacitors. In addition, the construction requires three switches for selectively supplying the reference voltage, the divided voltage and the ground voltage to the capacitors, respectively, so that an increase in the number of capacitors trebles the number of switches. As a result, in order to increase the segment assignment bits from three bits to four bits by way of example, eight capacitors and twenty-four switches need to be added. In this manner, the increase of the circuit elements required for the resolution enhancement of only one bit becomes enormous.

SUMMARY OF THE INVENTION

An object of this invention is to provide a linear D/A converter in which features of the weighted capacitance type converter and the resistor string type converter are combined and which is excellent in both the linearity and the monotonicity characteristics thereof, and also a successive approximation type A/D converter which employs the D/A converter.

Another object of this invention is to provide a novel converter construction which, in enhancing the resolution, does not require such an extreme increase in the number of elements of the capacitor array circuit.

A D/A converter according to this invention for accomplishing these objects is characterized by the provision of m capacitors corresponding to m upper bits of a digital signal, which have binary-weighted capacitance ratios and whose ends on one side are connected in common to an analog voltage line; a first potential supply line; a second potential supply line; a third potential supply line; a fourth potential supply line; a resistor string which is connected to a first potential at one end thereof and a second potential at the other end thereof and which divides a terminal voltage across both its ends by $2^n$; divided-voltage deriving means to derive voltages equal to $i/2^n$ (where i denotes a numerical value expressed by the n bits) and $(2^n-i)/2^n$ of the terminal voltage from said resistor string in accordance with the n lower bits of the digital signal and to deliver them to said third potential supply line and said fourth potential supply line, respectively; switching means to selectively connect the ends of the respective capacitors on the other side with said first, second, third and fourth potential supply lines; and means to control said switching means in accordance with the m upper bits of the digital signal.

The switching means comprises, in principle, a first group of switches which connect the other ends of the respective capacitors selectively to either of the first potential supply line or the second potential supply line, and a second group of switches which connect the other ends of the respective capacitors selectively to either of the third potential supply line or the fourth potential supply line instead of the first and second potential supply lines.

The switch control means controls the first group of switches with the digital signal of the m upper bits, and controls the second group of switches with a control signal generated in accordance with a bit pattern of the m-bit digital signal. The first group of switches operate so as to connect to the first potential supply line the capacitors corresponding to bits having the binary value "0" and to connect to the second potential supply line the capacitors corresponding to bits having the binary value "1", while the second group of switches operate so as to connect the capacitor of the lowest bit among the capacitors connected with the first potential supply line, to the third potential supply line instead of the first potential supply line and to connect the capacitors of lower bits than the capacitor of the aforecited lowest bit to the fourth potential supply line instead of the second potential supply line.

An A/D converter of the successive approximation type according to this invention is constructed by applying the foregoing D/A converter to a part of a local decoder and combining it with a voltage comparator.

Hereunder, this invention will be described in detail in conjunction with embodiments of the A/D converter with reference to the drawings.

DESCRIPTION OF THE PREFERRED EMBODIMENTS

Figure 1:
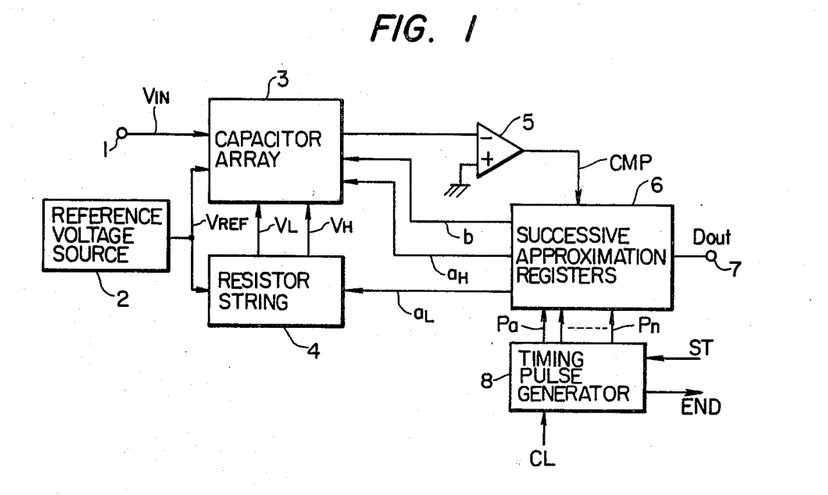
FIG. 1 is a diagram showing the general construction of an A/D converter according to this invention.

FIG. 1 is a diagram which shows the general construction of an A/D converter according to this invention, which includes an input terminal 1 for a sampled analog voltage $V_{IN}$, a voltage source 2 which generates a reference voltage $V_{REF}$, a capacitor array circuit 3 which determines the upper m bits of a digital output, a resistor string circuit 4 which determines the lower n bits of the digital output, a voltage comparator 5 which compares a voltage on the output line of the capacitor array circuit 3 with ground potential, successive approximation registers 6 which successively deliver switch control pulses b, $a_H$ and $a_L$ for the capacitor array circuit 3 and the resistor string 4 in response to the output CMP of the voltage comparator 5, and a pulse generator 8 which generates timing pulses $P_a-P_n$ for controlling the operation of the successive approximation registers 6 on the basis of a basic clock signal CL in response to a start signal ST applied from an external control device (not shown). In synchronism with the timing pulses $P_a-P_n$, the successive approximation logic circuit 6 generates the switch control pulses b, $a_H$ and a L and converts the input analog voltage $V_{IN}$ into the digital signal $D_{out}$ and then delivers it to an output terminal 7. When the A/D conversion operation for each analog input has ended, an end signal END is provided from the pulse generator 8 to the external control device.

Figure 2:
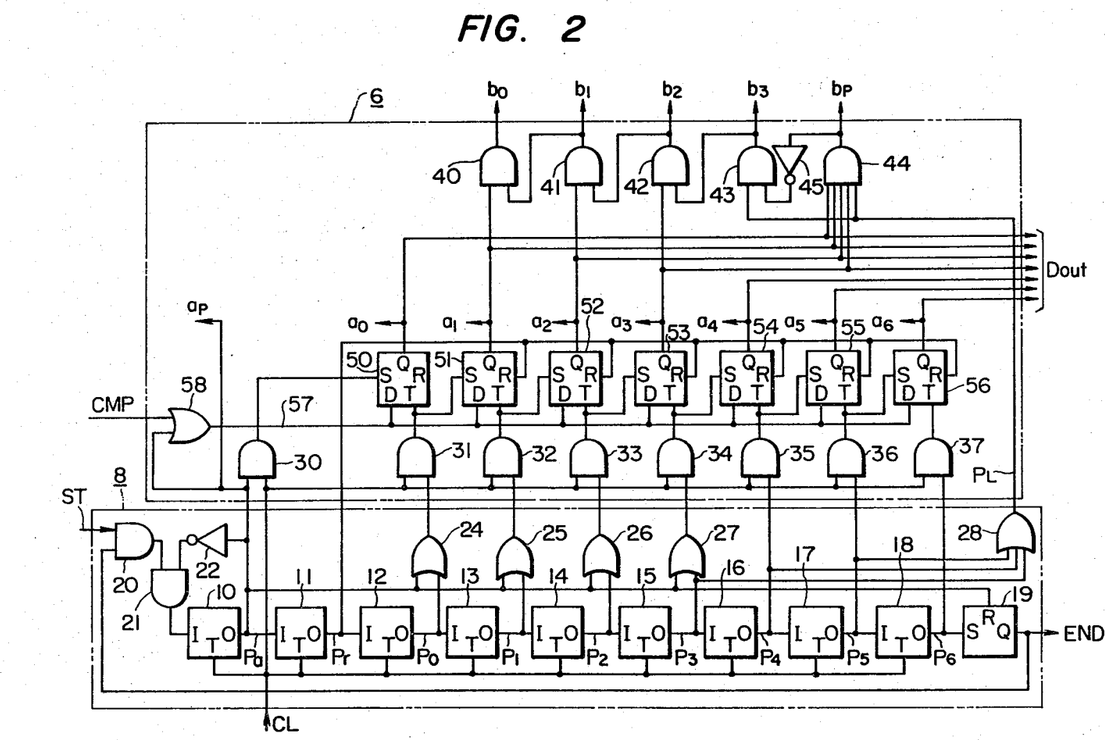
FIG. 2 is a circuit diagram showing specific arrangements of a pulse generation and successive approximation registers in the converter of FIG. 1.
Figure 3:
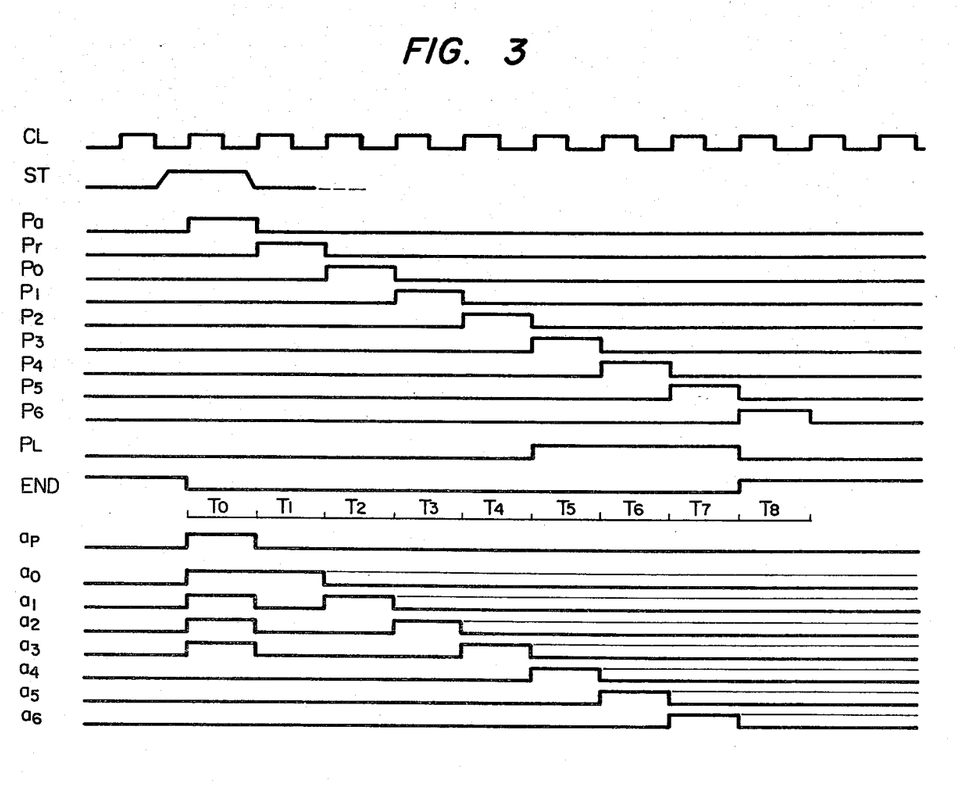
FIG. 3 is a signal waveform diagram for explaining the operations of the circuits in FIG. 2.

Specific examples of the arrangements and operations of the various circuit portions in the case of $m=4$ and $n=3$ will be described with reference to FIGS. 2 to 5. FIG. 2 shows an embodiment of the successive approximation logic circuit 6 as well as the timing pulse generator 8, while FIG. 3 shows signal waveforms in various parts.

The pulse generator 8 includes a shift register which consists of stages 10–18 and which shift-operates in synchronism with the basic clock CL, and a flip-flop 19 which is connected to the final stage 18 of the shift register. The flip-flop 19 is reset by the pulse $P_a$ which is provided from the first stage 10 of the shift register at the start of the A/D conversion operation, while it is set by the pulse $P_6$ which is provided from the final stage 18 at the end of the A/D conversion. The set output of the flip-flop 19 becomes the conversion operation end signal END. When, under the stage under which the signal END is "1", the start signal ST is received, it is applied to an AND gate 21 through an AND gate 20. At this time, the output $P_a$ of the first stage 10 is in the state "0", so that the AND gate 21 is kept enabled by the output of an inverter 22 receiving the pulse $P_a$. Accordingly, the start signal ST passes through the AND gate 21 and is applied to the first stage 10, whereupon the output $P_a$ becomes "1" upon rise of the basic clock CL. At the next clock input, the output $P_r$ of the second stage 11 becomes "1", and the output $P_a$ of the first stage 10 returns to "0". Operations similar to the above occur in the second stage 11 to the final stage 18 in succession, with the result that the timing pulses $P_a$, $P_r$ and $P_0$–$P_6$ shown in FIG. 3 are generated from the respective stages of the shift register in periods $T_0$–$T_8$.

The timing pulse $P_a$ is impressed on the successive approximation logic circuit 6 and becomes a control pulse $a_p$. The pulse $P_a$ is also impressed on one input terminal of an AND gate 30 within the logic circuit 6, the other input of which receives the clock signal CL. Each of the timing pulses $P_0$, $P_1$, $P_2$ and $P_3$ is impressed on one input terminal of the corresponding one of the AND gates 31–34 within the logic circuit 6 through the corresponding one of OR gates 24–27, along with the pulse $P_a$. Each of the timing pulses $P_4$, $P_5$ and $P_6$ is impressed on one input terminal of the corresponding one of AND gates 35, 36 and 37 within the logic circuit 6. In addition, these pulses are collected by an OR gate 28 within the pulse generator 8 and are impressed on AND gates 43 and 44 within the logic circuit 6 as a timing pulse $P_L$. Each of the AND gates 30–37 has the other input terminal supplied with the basic clock CL and provides a timing pulse in synchronism therewith.

The successive approximation logic circuit 6 includes flip-flops 50–56 for generating control pulses $a_0$–$a_6$, respectively, and AND gates 40–44 for generating control pulses $b_0$–$b_p$, respectively. The flip-flops 50–56 are of the D-type having set (S) and reset (R) terminals. They receive the state signal of a signal line 57 at the timings of the output pulses from the AND gates 31–37 and put the control pulses $a_0$–$a_6$ into "1" or "0" states in correspondence with the states of the signal line 57, respectively.

The output CMP of the voltage comparator 5 and the timing pulse $P_a$ from the pulse generator 8 are supplied to the signal line 57 through an OR gate 58. The set terminal of the flip-flop 50 is supplied with the output of the AND gate 30. The set terminals of the respective flip-flops 51–56 are connected to receive the timing signals of the flip-flops 50–55 of the preceding adjacent stages, while the reset terminals thereof are connected to receive the timing signal $P_r$. Owing to such construction, as illustrated in FIG. 3, the pulses $a_p$ and $a_0$–$a_3$ are provided as "1" in the period $T_0$, and the pulses $a_0$–$a_6$ are successively provided as "1" in the periods $T_1$–$T_7$. Among these pulses, those pulses $a_0$–$a_3$ are applied to the capacitor array circuit 3 as the switch control pulse $a_H$, and those pulses $a_4$–$a_6$ are applied to the resistor string circuit 4 as the switch control pulse $a_L$. The pulses $a_0$–$a_6$ successively provided in the periods $T_1$–$T_7$ are held at "1" or "0" in accordance with the states of the output CMP of the voltage comparator 5 in the periods $T_2$–$T_8$, and they become the binary output data ($D_{out}$) representative of the result of the A/D conversion.

A circuit portion which consists of the AND gates 40–44 and an inverter 45 provides the pulses $b_p$ and $b_0$–$b_3$ meeting the following logical expressions, in the output period of the pulse $P_L$ or the output periods of the control pulses $P_4$, $P_5$ and $P_6$:

$$b_p = P_L \cdot a_0 \cdot a_1 \cdot a_2 \cdot a_3 \quad (1)$$

$$b_3 = P_L \cdot \bar{b}_p \quad (2)$$

$$b_2 = b_3 \cdot a_3 \quad (3)$$

$$b_1 = b_2 \cdot a_2 \quad (4)$$

$$b_0 = b_1 \cdot a_1 \quad (5)$$

Figure 4:
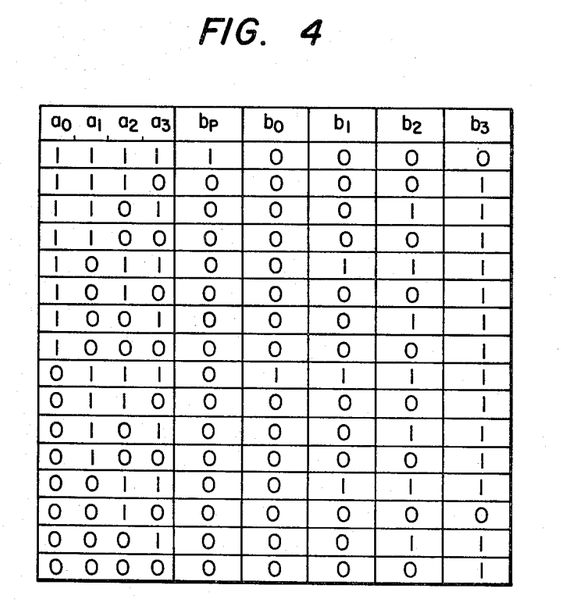
FIG. 4 is a diagram indicating the relations between control pulses $b_0-b_3$ and $b_p$ and control pulses $a_0-a_3$ which are provided from the successive approximation registers in FIG. 2.

These pulses are applied to the capacitor array circuit 3 as the switch control signal b. The corresponding relations between the contents of the pulses $a_0$–$a_3$ and the pulses $b_p$ and $b_0$–$b_3$ are as indicated in FIG. 4.

Figure 5:
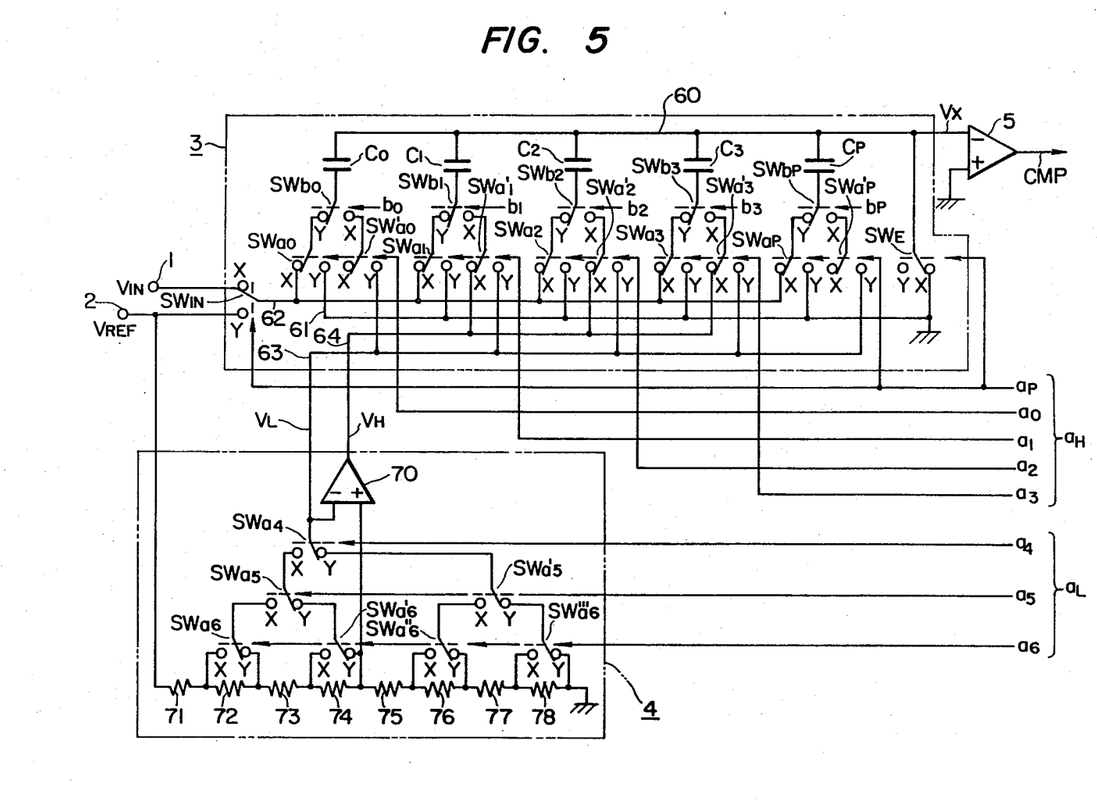
FIG. 5 is a circuit diagram showing specific arrangements of a capacitor array circuit and a resistor string circuit in the device of FIG. 1.

FIG. 5 shows a specific circuit arrangement of the capacitor array circuit 3 and the resistor string circuit 4 which are switch-controlled by the control pulses b, $a_H$ and $a_L$ described above.

The capacitor array circuit 3 consists of capacitors $C_0$, $C_1$, $C_2$, $C_3$ and $C_p$ whose ends on one side are connected in common to an analog voltage output line 60, and groups of switches which are connected to the ends of the capacitors on the other side. The capacitors $C_0$–$C_3$ have binary-weighted capacitance ratios, and their capacitances are related to the unit capacitance C as $C_0 = 8C$, $C_1 = 4C$, $C_2 = 2C$ and $C_3 = C$. The capacitor $C_p$ has the unit capacitance C, and is added in order to make the total capacitance of the capacitor array 16C.

The groups of switches which are connected to the capacitor array consist of switches $SW_{b0}$–$SW_{b3}$ and $SW_{bp}$ which are changed-over onto an X or Y terminal side by the respective control signals $b_0$–$b_3$ and $b_p$, switches $SW_{a0}$–$SW_{a3}$ and $SW_{ap}$ which are controlled by the respective control signals $a_0$–$a_3$ and $a_p$ so as to connect the Y terminals to a ground voltage supply line 61 or a reference voltage supply line 62, and switches $SW_{a0}'$–$SW_{a3}'$ and $SW_{ap}'$ which are controlled by the respective control signals $a_0$–$a_3$ and $a_p$ so as to connect the X terminals of switches $SW_{b1}$–$SW_{b3}$ to a voltage $V_L$ supply line 63 or a voltage $V_H$ supply line 64. Here, the capacitor $C_0$ of the most-significant bit (MSB) and the additional capacitor $C_p$ have no chance of connection with the voltage $V_H$ supply line 64 unlike the other capacitors. Accordingly, the switches $SW_{a0}'$ and $SW_{ap}'$ merely control the connections of the X terminals of the respective switches $SW_{b0}$ and $SW_{bp}$ with the voltage $V_L$ supply line 63. In this specification, the operation will be described by assigning letter X or Y to the connection terminals of the switches and under the assumption that the switch is thrown on the X terminal side when the switch control pulses is in the state "1", while it is thrown on the Y terminal side when the pulse is in the stage "0".

The analog voltage output line 60 is provided with a switch $SW_E$ for selectively grounding it when the analog signal $V_{IN}$ is received (sampled). The reference voltage supply line 62 is provided with a switch $SW_{IN}$ so that it can be selectively connected to the input terminal 1 of the analog voltage $V_{IN}$ or the reference voltage ($V_{REF}$) source 2. These switches are controlled by the control pulse $a_p$.

The resistor string circuit 4 consists of resistor elements 71–78 which are connected in series and which serve to divide the reference voltage $V_{REF}$ by 8, groups of switches which serve to derive divided voltages, and a differential inverting amplifier 70 of gain 1 (unity) which operates with its plus side input as a reference. The groups of switches consist of a switch $SW_{a4}$ which is controlled by the pulse $a_4$, switches $SW_{a5}$ and $SW_{a5}'$ which are controlled by the pulse $a_5$, and switches $SW_{a6}$–$SW_{a6}'''$ which are controlled by the pulse $a_6$. These switches are pyramidically connected as shown in the figure. The resistor elements 71–78 have equal resistance values, and voltages $i/8\ V_{REF}$ (where $i=0-7$) are derived as the voltages $V_L$ to the supply line 63 in accordance with the connection patterns of the switches. The inverting input of the amplifier 70 is supplied with the voltage $V_L$, and the non-inverting input with a voltage of $4/8\ V_{REF}$, with the result that the voltage of $$V_H = \frac{(8-i)}{8} V_{REF}$$

is delivered to the voltage supply line 64.

According to this invention, in the circuit arrangement described above, the signals $a_0$–$a_3$ are first used to sequentially operate the groups of switches of the capacitor array and to determine the upper bits of the binary word. In this case, the summation of the coefficients of the capacitors connected to the reference voltage $V_{REF}$ indicates the lower end of that segment in the conversion characteristic to which the input voltage $V_{IN}$ belongs. The coefficient values of the capacitors are binary-indicated with the switch control signals $a_0$–$a_3$ as the respective bits. According to this invention, after the conversion operations of the upper bits, the switches are reorganized by the signals $b_0$–$b_3$ and $b_p$ so that, among the capacitors connected to the ground voltage, the capacitor of the least-significant bit may be supplied with the divided voltage $V_L$, while the capacitors of bits lower than that of the aforecited capacitor may be supplied with the derived voltage $V_H$. Using the signals $a_4$–$a_6$, the switches of the resistor string circuit are operated to sequentially change the voltages $V_H$ and $V_L$ and to determine the lower bits.

At this time, the input voltage $V_{IN}$ is represented as follows, by letting $C_T$ denote the total capacitance of the capacitor array, $C_S$ denote the sum of the capacitances of the capacitors connected to the reference voltage $V_{REF}$, $C_A$ denote the sum of the capacitances connected to the voltage $$V_H \left( = \frac{2^n - i}{2^n} V_{REF} \right),$$

and $C_B$ denote the capacitance of the capacitor connected to the voltage $$V_L \left( = \frac{i}{2^n} V_{REF} \right): \tag{6}$$

$$V_{IN} = \frac{V_{REF}}{C_T} \left( C_S + C_B \frac{i}{2^n} + C_A \frac{2^n - i}{2^n} \right) =$$

$$\frac{V_{REF}}{C_T}(C_S + C_A) + \frac{V_{REF}}{C_T}(C_B - C_A) \frac{i}{2^n}$$

That is, in the converter of this invention, on the basis of the conversion result $C_S + C_A/C_T V_{REF}$ of the upper bits, the section extending therefrom the lower end $C_S + C_B/C_T V_{REF}$ of the segment of the adjoining upper bit is divided into $2^n$ steps, and the voltage $$\frac{C_B - C_A}{C_T} \cdot \frac{i}{2^n} V_{REF}$$

of the i-th step and the base voltage are added to evaluate the input analog voltage $V_{IN}$.

The circuit operations of the embodiment in FIG. 5 will be described in due order with reference to FIGS. 2 and 3 on the assumptions that the capacitor array is correctly weighted and that the resistor string can correctly divide the reference voltage $V_{REF}$ into eight equal parts. The total capacitance $C_T$ of the capacitor array is 16C in this case.

In the first period $T_0$, the pulses $a_p$ and $a_0$–$a_3$ are "1", and the pulses $b_p$ and $b_0$–$b_3$ are "0" (they are "0" during the periods other than $T_5$–$T_7$). Therefore, the switches in the capacitor array circuit 3 lie in the state shown in FIG. 5, and the capacitances $C_0$–$C_3$ and $C_p$ are charged with the input analog voltage $V_{IN}$ through the voltage supply line 62.

In the next period $T_1$, only the pulse $a_0$ is "1" and all the others are "0", so that the switches $SW_{IN}$ and $SW_E$ are changed-over onto the Y terminal side. Thus, the reference voltage $V_{REF}$ is applied via the voltage supply line 62 to capacitor $C_0$, and a voltage $V_x$ appears at the inverting input of the voltage comparator 5. During this period $T_1$, only the capacitor $C_0$ of the most-significant bit is connected to the reference voltage supply line 62, and the other capacitors $C_1$–$C_3$ and $C_p$ are connected with the ground voltage supply line 61. Accordingly, a charge redistribution takes place within the capacitor array, and the voltage of the output line 60 becomes $V_x = -V_{IN} + (8/16)V_{REF}$. Supposing here that the magnitude of the input voltage $V_{IN}$ is $(27/128)V_{REF}$ which corresponds to the third step of the third segment, the value of the output voltage $V_x$ in the period $T_1$ becomes plus, and the output CMP of the voltage comparator 5 becomes "0".

In the period $T_2$, the flip-flop 50 within the successive approximation logic circuit 6 receives the aforecited output CMP and makes the pulse $a_0$ "0" and holds it there, and the flip-flop 51 makes the pulse $a_1$ "1". Accordingly, the capacitor $C_0$ is connected to the ground voltage supply line 61, and the second capacitor $C_1$ is connected to the reference voltage supply line 62. In this case, the output voltage $V_x$ becomes $-(27/128)V_{REF}+(4/16)V_{REF}>0$, so that the value CMP is "0".

In the period $T_3$, accordingly, the pulse $a_1$ is held at "0" and the pulse $a_2$ becomes "1". In this period, the third capacitor $C_2$ is supplied with the reference voltage $V_{REF}$, the output voltage becomes $V_x = -(27/128)V_{REF}+(2/16)V_{REF}<0$, and the value CMP becomes "1".

In the period $T_4$, the pulse $a_2$ is held at "1" and the pulse $a_3$ becomes "1", so that the voltage becomes $V_x = -(27/128)V_{REF}+(3/16)V_{REF}<0$ and that the output CMP becomes "1". As a result, the contents of the upper 4 bits are determined to be $[a_0, a_1, a_2, a_3] = [0011]$.

The lower three bits $a_4$, $a_5$ and $a_6$ are converted as follows. In the periods $T_5$–$T_7$, the AND gates 43 and 44 are operated by the output pulse $P_L$ from the pulse generator 8, and the switch control pulses $b_0$–$b_3$ and $b_p$ change according to the contents of the upper four bits $a_0$–$a_3$. Since, in this example, the upper four bits are [0011], the pulses $[b_p, b_0, b_1, b_2, b_3]$ become [00111] as indicated in FIG. 4. Owing to the pulse changes, the switches $SW_{b1}$, $SW_{b2}$ and $SW_{b3}$ are respectively changed-over from the Y terminal side to the X terminal side in the capacitor array circuit 3. As a result, the capacitors $C_2$ and $C_3$ are connected to the voltage $V_H$ supply line 64 in lieu of the reference voltage $V_{REF}$ supply line 62, and the capacitor $C_1$ of the upper adjacent bit is connected to the voltage $V_L$ supply line 63 in lieu of the ground voltage supply line 61.

When, in the above state, the switch control pulse $a_4$ has become "1" in the period $T_5$, the switch $SW_{a4}$ is connected onto the X terminal side and all the other switches are connected onto the Y terminal side in the resistor string circuit 4, and both of the voltages $V_L$ and $V_H$ become a value of $(4/8)V_{REF}$. In this case, the output voltage $V_x$ becomes $$V_x = -\frac{27}{128} V_{REF} + \frac{7}{2 \times 16} V_{REF} > 0,$$

and the output CMP of the voltage comparator becomes "0".

In the period $T_6$, the pulse $a_4$ becomes "0" and the pulse $a_5$ "1", the voltages $V_L=(2/8)V_{REF}$ and $V_H=(6/8)V_{REF}$ are provided, and the value of the output $V_x$ is $V_x=(27/128)V_{REF}+(26/128)V_{REF}<0$, so that the output CMP becomes "1".

In the period $T_7$, the pulse $a_5$ is held at "1", and the pulse $a_6$ becomes "1". In this case, the voltages become $V_L=(3/8)V_{REF}$ and $V_H=(5/8)V_{REF}$ and the value of the output $V_x$ therefore becomes $V_x=-(27/128)V_{REF}+(27/128)V_{REF}=0$, so that the output CMP becomes "1". As a result, $a_6=$"1" is held in the period $T_8$ in which the conversion operation ends, and the contents of the lower three bits are determined to be $[a_4, a_5, a_6]=[011]$.

Figure 6A:
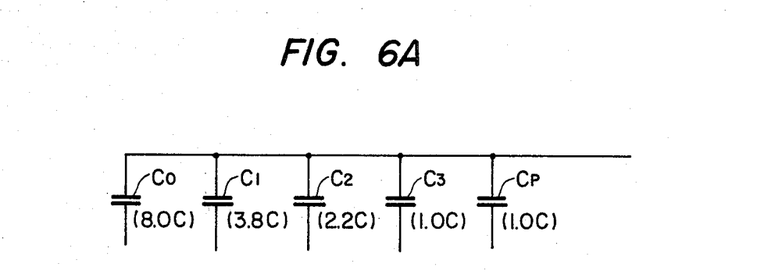
FIGS. 6A and 6B are diagrams for explaining the relationship between the errors of the capacitance ratios of a capacitor array and the input/output characteristic in the converter of this invention.
Figure 6B:
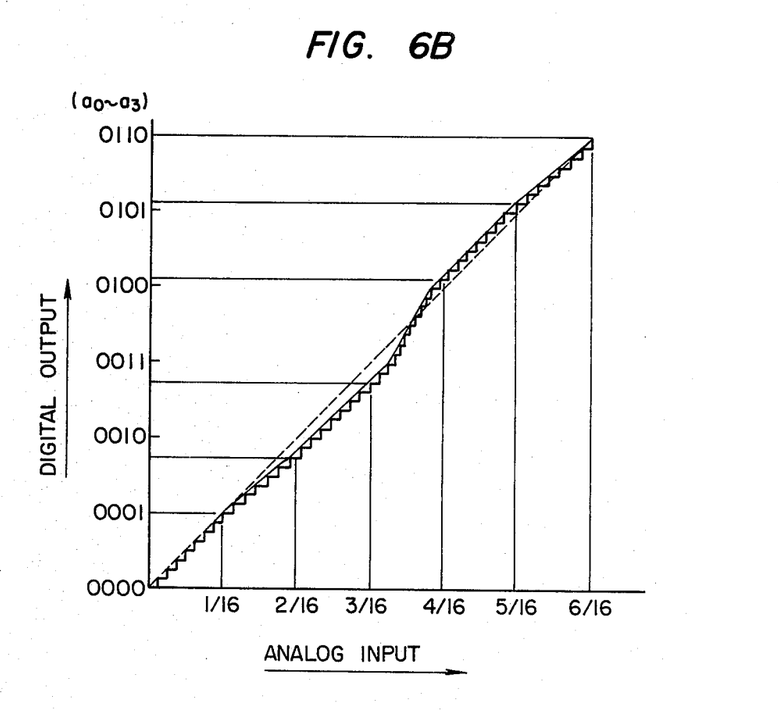

As apparent from the above description, the converter of this invention executes the conversion of the upper bits by the use of the capacitors having the binary-weighted capacitance ratios. Therefore, even in the case where the number of bits is increased in order to enhance the conversion precision, the number of elements of the capacitor array circuit to be increased may be small. The capacitor array may well realize the binary weights by connecting capacitors of unit capacitances in parallel. According to this invention, however, the required number of capacitors may be essentially a small number corresponding to the number of bits for assigning the segments, and hence, individual capacitors having unequal area ratios can be used for realizing the binary-weighted capacitance ratios. In this case, even when the actual capacitance ratios somewhat deviate from the correct binary coefficients, the monotonicity is assured because the changes of the step voltages affecting the conversion precision are made with the resistor string. An example of the capacitor array in the case where the actual capacitance ratios have deviated from the correct capacitance ratios, and the input/output characteristic thereof are shown in FIGS. 6A and 6B, respectively.

Figure 7:
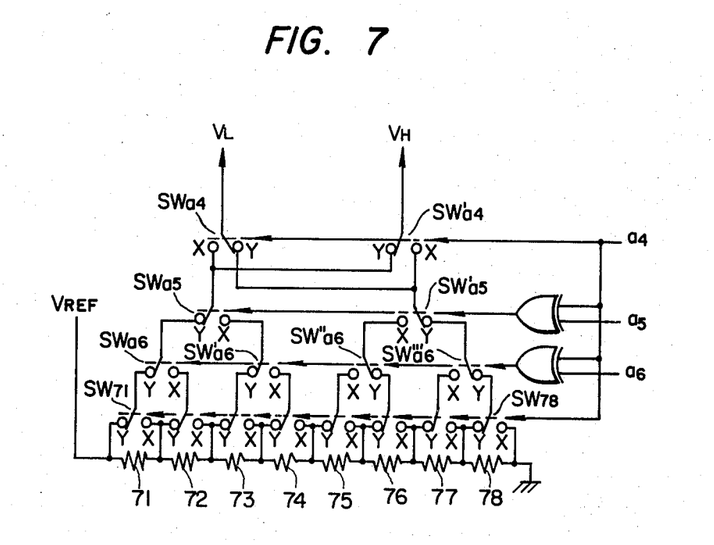
FIG. 7 is a circuit diagram showing another example of the arrangement of the resistor string circuit.

FIG. 7 shows another embodiment of the resistor string circuit 4 which is applied to this invention. In this circuit, to the end of dispensing with the differential inverting amplifier 70 in FIG. 5, switches $SW_{71}$–$SW_{78}$ for selecting tap voltages are disposed in correspondence with the resistor elements 71–78, and the switch array is organized so that the tap voltages equidistant from both the ends of the resistor string may be selected to become the voltages $V_H$ and $V_L$.

Figure 8:
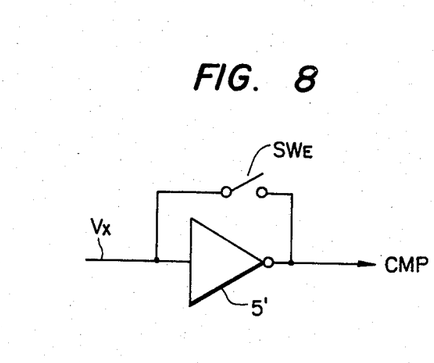
FIG. 8 is a diagram showing another example of the arrangement of a voltage comparator in the converter of this invention.

FIG. 8 shows an inverter 5' which can be substituted for the voltage comparator 5. This type is more practical in case of constructing the converter with a MOS type circuit.

Figure 9:
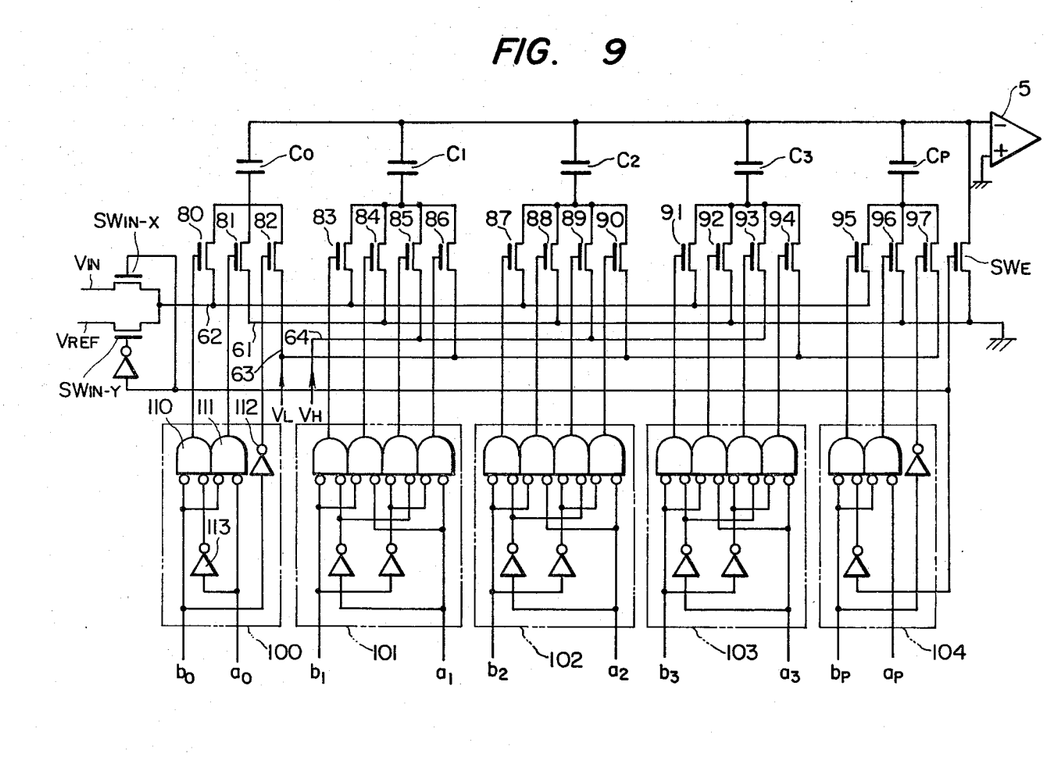
FIGS. 9 and 10 are circuit diagrams showing different embodiments of the capacitor array circuit and the resistor string circuit, respectively.

FIG. 9 shows an example of the construction of the capacitor array circuit 3 which is suitable for a MOS type IC. In the circuit of FIG. 5 already explained, the switches $SW_{b0}$–$SW_{b3}$ and $SW_{bp}$ which are controlled by the control signals $b_0$–$b_3$ and $b_p$ and the switches $SW_{a0}$–$SW_{a3}$ and $SW_{ap}$ or $SW_{a0}'$–$SW_{a3}'$ and $SW_{ap}'$ which are controlled by the control signals $a_0$–$a_3$ and $a_p$ are inserted in series connection between the respective capacitors $C_0$–$C_3$ and $C_p$ and the voltage supply lines 61–64. In contrast, in the circuit of FIG. 9, switches 80–97 are inserted between the capacitors $C_0$–$C_3$ and $C_p$ and the voltage supply lines 61–64, logic circuits 100–104 which receive the control pulses $a_0$ and $b_0$, $a_1$ and $b_1$, ..., and $a_p$ and $b_p$, respectively, are disposed in correspondence with the respective capacitors, and the respective switches are controlled "on" and "off" by the outputs of these logic circuits.

The operation will be described with note taken of, for example, the logic circuit 100 of the most-significant bit. This circuit consists of two 2-input NOR gates 110 and 111, and two inverters 112 and 113. The NOR gate 110 turns "on" the MOS switch 80 at $[\bar{b}_0 \cdot a_0]=$"1", the NOR gate 111 turns "on" the MOS switch 81 at $[\bar{a}_0 \cdot \bar{b}_0]=$"1", and the inverter 112 turns "on" the MOS switch 82 at $[\bar{b}_0]=$"1". As a result, the capacitor $C_0$ is connected to the voltage supply lines 62, 61 and 63 under the same conditions as in the case of the circuit of FIG. 5. The other logic circuits 101–104 connect the respective capacitors $C_1$–$C_3$ and $C_p$ selectively to the voltage supply lines 61–64 under conditions equivalent to those in the circuit of FIG. 5. With such construction in which only one switch intervenes between the capacitor and the specific voltage supply line, there are the advantages that the speed of the circuit operation can be raised and that the required area of the switch portion can be reduced.

Figure 10:
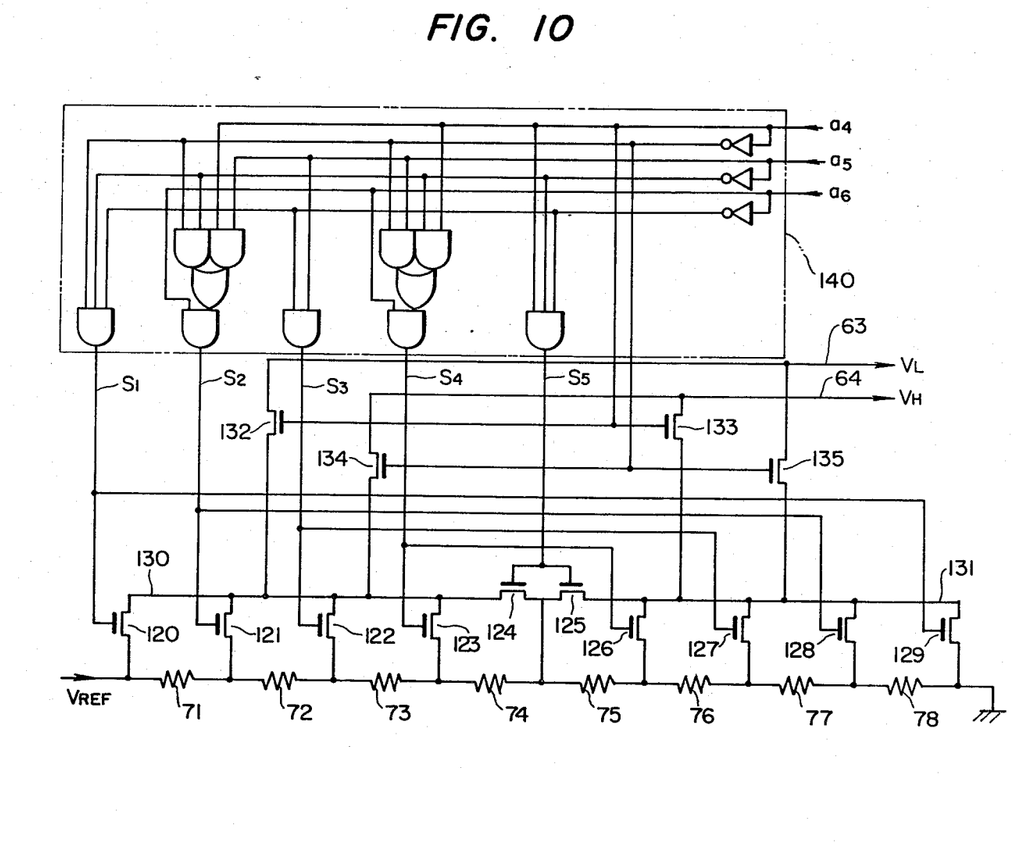

FIG. 10 shows another embodiment of the resistor string circuit which employs a logic circuit 140 in order to suppress the number of switches in series connection. Among the divided voltages owing to the resistor elements 71-78, those voltages $V_{REF}-(4/8)V_{REF}$ are taken out on a voltage line 130 through switches 120-124, and those voltages $(4/8)V_{REF}-0$ on a voltage line 131 through switches 125-129. When the control bit $a_4$ is "1", switches 132 and 133 turn "on" and the divided voltages on the voltage line 130 and the voltage line 131 are respectively delivered to the voltage supply lines 63 and 64 as the voltages $V_L$ and $V_H$. Conversely, in case where the control bit $a_4$ is "0", switches 134 and 135 turn "on", and the divided voltages on the voltage lines 130 and 131 are respectively delivered as the voltages $V_H$ and $V_L$. This circuit is so constructed that the switches 120 and 129, 121 and 128, ..., and 124 and 125 which lie in symmetric positions from both the ends of the resistor string are controlled in common by output signals $S_1, \ldots,$ and $S_5$ from the logic circuit 140, respectively, and that when a voltage $i/n\ V_{REF}$ appears on one voltage line 130, a voltage $$\frac{n-i}{n} V_{REF}$$

appears on the other voltage line 131.

Figure 11A:
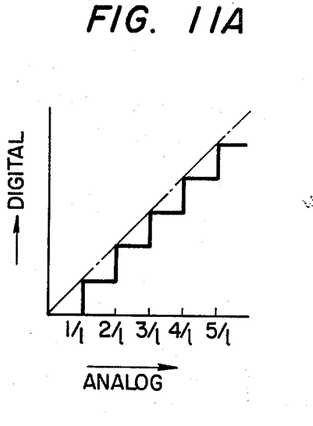
FIGS. 11A and 11B are graphs showing input/output characteristics in a standard construction and a modified construction according to this invention, respectively.
Figure 11B:
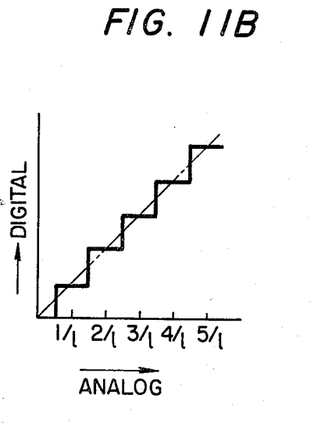
Figure 12:
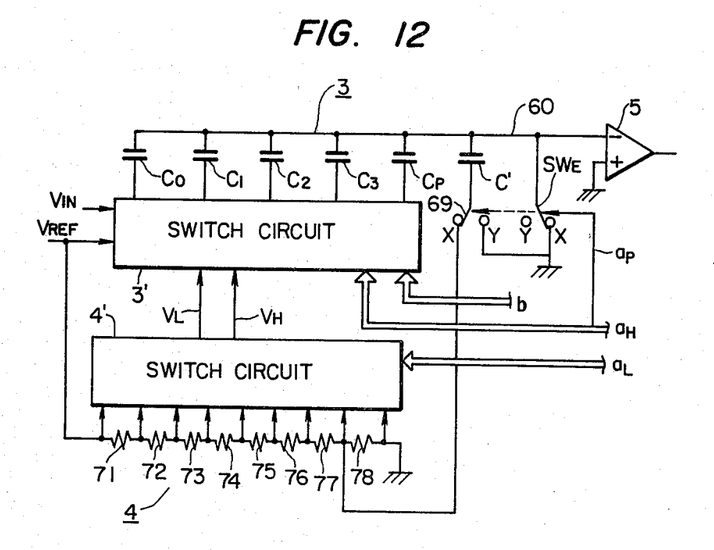
FIG. 12 is a circuit arrangement diagram showing a modified embodiment of the converter according to this invention.

Now, a modified embodiment of this invention will be described with reference to FIGS. 11A, 11B and 12. With the circuit arrangements thus-far described, an input/output characteristic shown in FIG. 11A has been obtained by equally dividing the reference voltage $V_{REF}$ by $l$ (where $l=2^m \times 2^n$, m=the number of upper bits, and n=the number of lower bits) and disregarding analog values less than the LSB. In contrast, the present embodiment gives an input/output characteristic an offset of ½LSB, as illustrated in FIG. 11B, so that analog inputs within ranges of $(V_{REF}/l)$ $(i-\frac{1}{2})$ to $(V_{REF}/l)$ $(i+\frac{1}{2})$ can be converted into digital values i. FIG. 12 shows the circuit arrangement of such embodiment.

In FIG. 12, symbol 3' indicates a switch circuit portion for connecting the capacitors $C_0-C_p$ to the voltage supply lines, and symbol 4' a switch circuit portion for selecting the outputs of the resistor string at 71-78. These switch circuit portions are the same as in the case of FIG. 5. The present embodiment is characterized in that a capacitor C' having a capacitance equal to ½ of the unit capacitance is added to the capacitor array circuit 3 so as to afford the minimum divided voltage $(1/2^n)V_{REF}$ of the resistor string through a switch 69 when the input voltage $V_{IN}$ is sampled.

Letting C denote the unit capacitance, i denote the converted value by the capacitor array (the value of the upper m bits) and j denote the converted value by the resistor string (the value of the lower n bits), the following equations hold in the above circuit in view of the fact that charges at the input of the analog voltage $V_{IN}$ are conserved in the capacitor array during the conversion operation:

$$C_T \cdot V_{IN} + \tfrac{1}{2}C \cdot (V_{REF}/2^n) = C_R \cdot V_{REF} + C \cdot (j/2^n) V_{REF} \quad (7)$$

where $C_T = 2^m \cdot C$ and $C_R = i \cdot C$ \quad (8)

From equations (7) and (8), the input voltage $V_{IN}$ becomes:

$$V_{IN} = (2^n \cdot i + j - \tfrac{1}{2}) \cdot \frac{1}{2^n \times 2^m} V_{REF} \quad (9)$$

This equation signifies that the offset of ½LSB has been given to the conversion result. When the offset of ½LSB is given in this manner, equivalently the input is subjected to the "counting fraction over ½ as one and disregarding the rest" and then to the conversion processing. In particular, the embodiment is effected for A/D conversion use of high precision in which quantization errors are problematic.

Although, in the above, the application of this invention to the A/D converter has been described, it is to be understood that the converter operates as a D/A converter by applying bit signals of an input digital quantity as the control pulses $a_0-a_6$ and deriving an analog output from the output line 60 of the capacitor array circuit.

What is claimed is:

1. A digital-to-analog converter comprising m capacitors corresponding to m upper bits of a digital signal having n lower bits, said capacitors having binary-weighted capacitance ratios and whose ends on one side are connected in common to an analog voltage output line; a first potential line; a second potential supply line; a third potential supply line; a fourth potential supply line; a resistor string which is connected to a first potential at one end thereof and a second potential at the other end thereof and which divides the terminal voltage across both its ends by $2^n$; divided-voltage deriving means connected to said resistor string to sequentially derive first and second voltages equal to $i/2^n$ (where i denotes a numerical value expressed by the n bits of said digital signal) and $(2^n-i)/2^n$ of said terminal voltage, respectively, from said resistor string in accordance with the n lower bits of the digital signal and to deliver them to said third potential supply line and said fourth potential supply line, respectively; switching means for selectively connecting the ends of the respective capacitors on the other side thereof with said first, second, third and fourth potential supply lines; and means for controlling said switching means sequentially in accordance with the m upper bits of the digital signal and the voltage appearing on said analog voltage output line.

2. A digital-to-analog converter according to claim 1, wherein said switching means comprises a first group of switches which connect the other ends of said respective capacitors selectively to either said first potential supply line or said second potential supply line, and a second group of switches which connect said other ends of said respective capacitors selectively to either said third potential supply line or said fourth potential supply line instead of said first and second potential supply lines, and wherein the switch control means includes first means for controlling said first group of switches on the basis of the m bits of the digital signal and the voltage appearing on said analog voltage output line, and second means for selectively operating said second group of switches on the basis of a control signal generated in accordance with the bit pattern of the m-bits of said digital signal.

3. A digital-to-analog converter according to claim 2, wherein said first means includes means for operating said first group of switches to connect to said first potential supply line the capacitors corresponding to bits having a binary value "0" in said m-bits of said digital signal and to connect to said second potential supply line the capacitors corresponding to bits having a binary value "1", and wherein said second means includes means for operating said second group of switches so as to connect the capacitor of the lowest bit among the capacitors connected with said first potential supply line to said third potential supply line instead of said first potential supply line and to connect the capacitors of lower bits than said capacitor connected with said third potential supply line, to said fourth potential supply line instead of said second potential supply line.

4. A digital-to-analog converter according to claim 1, wherein said switch control means includes a first logic circuit which provides a control signal in accordance with the bit pattern of said m-bits of said digital signal, and a second logic circuit which generates a signal for controlling said switching means with a predetermined logic on the basis of the output of said first logic circuit and said m-bits of said digital signal.

5. An analog-to-digital converter comprising m capacitors corresponding to m upper bits of a digital signal having n lower bits, said capacitors having binary-weighted capacitance ratios and whose ends on one side are connected in common to an analog voltage output line; a voltage comparator which compares the voltage of said analog voltage output line with a predetermined potential; signal input means for charging the respective capacitors with an input analog voltage; a first potential supply line; a second potential supply line; a third potential supply line; a fourth potential supply line; a resistor string which is connected to a first potential at one end thereof and a second potential at the other end thereof and which divides a terminal voltage across both its ends by $2^n$; divided-voltage deriving means to selectively derive first and second voltages equal to $i/2^n$ (where i denotes a numerical value expressed by the n lower bits of the digital signal and $(2^n - i/2^n)$ of said terminal voltage from said resistor string and to deliver them to said third potential supply line and said fourth potential supply line, respectively; switching means for selectively connecting the ends of the respective capacitors on the other side thereof with said first, second, third and fourth potential supply lines; a pulse generator which generates timing pulses; and successive approximation register means for applying control pulses to said signal input means, said switching means and said divided voltage deriving means in a predetermined sequence in response to said timing pulses and an output of said voltage comparator and for providing a digital signal corresponding to said input analog voltage.

6. An analog-to-digital converter according to claim 5, wherein said switching means comprises a first group of switches which connect the other ends of said respective capacitors selectively to either said first potential supply line or said second potential supply line, and a second group of switches which connect said other ends of said respective capacitors selectively to either said third potential supply line or said fourth potential supply line instead of said first and second potential supply lines; and wherein said successive approximation register means includes means to provide a first control signal which corresponds to the m upper bits of the digital signal and which serves to control said first group of switches, means to provide a second control signal which is determined in dependence on a state of said first control signal and which serves to control said second group of switches, and means to provide a third control signal which corresponds to the n lower bits of said digital signal and which serves to control said divided voltage deriving means.

7. An analog-to-digital converter according to claim 6, wherein said first group of switches operate so as to connect to said first potential supply line the capacitors corresponding to bits having a binary value "0" in said first control signal and to connect to said second potential supply line the capacitors corresponding to bits having a binary value "1", and wherein said second group of switches operate so as to connect during conversion of the n lower bits the capacitor of the lowest bit among the capacitors connected with said first potential supply line to said third potential supply line and the capacitors of lower bits than said capacitor connected with said third potential supply line to said fourth potential supply line.

8. An analog-to-digital converter according to claim 5, further comprising an additional capacitor which is connected to said analog voltage output line and which has a capacitance equal to ½ of a unit capacitance value possessed by each of said m capacitors, and means to supply said additional capacitor with a voltage equal to $1/2^n$ of said terminal voltage derived from said resistor string in synchronism with said signal input means.

9. A digital-to-analog converter comprising:
m capacitors corresponding to m upper bits of a digital signal having n lower bits, said capacitors having binary-weighted capacitance ratios and whose ends on one side are connected in common to an analog voltage output line;
first means connected to first and second potentials for providing different third and fourth potentials for each of said n bits, wherein said third potential changes from the first potential toward the second potential with increase of i (where i is the decimal value for the n bits), and a sum of the third and fourth potentials is equal to the second potential;
second means for applying to each of the other ends of said respective capacitors, selectively, one of said first to fourth potentials in accordance with the values of said m bits, in such a manner that a first capacitor which corresponds to a lowest bit among capacitors which correspond to a first binary value of the m bits is provided with the third potential, and second capacitors which correspond to a second binary value of the m bits lower than the first capacitor are provided with the fourth potential, and other capacitors are provided with either the first or second potential depending on whether the corresponding bits have the first or second binary value.

10. A digital-to-analog converter of claim 9, wherein said third and fourth potentials are divided voltages between the first and second potentials respectively by $i/2^n$ and by $(2^n - i/2^n)$.

11. A digital-to-analog converter of claim 10, wherein said first means comprises:
a resistor string which is connected to the first and second potentials at the respective ends thereof and which divides the terminal voltage across the resistor string by $2^n$; and
divided-voltage deriving means connected to said resistor string to derive the third and fourth potentials in response to the n bits.

12. A digital-to-analog converter of claim 11, wherein said divided-voltage deriving means comprises means for deriving an intermediate voltage between the first and second potentials; means for selecting the third potential from the divided voltages across the resistor string in response to the n bits; and means for generating the fourth potential in response to the intermediate voltage and the selected third potential.

13. A digital-to-analog converter of claim 11, wherein said divided voltage deriving means comprises means for selecting the third potential from the divided voltages across the resistor string in response to the n bits, and means for selecting the fourth potential from the divided voltages across the resistor string in response to the n bits.

14. A digital-to-analog converter of claim 9, wherein said second means comprises a plurality of switch means respectively interposed between the other ends of the respective capacitors and the first to fourth potentials; and
control means for controlling said plurality of switch means in response to the m digits.

15. A digital-to-analog converter of claim 14, wherein each of said switch means comprises four switches each interposed between one of the other ends of the capacitors and one of the first to fourth potentials, and said control means comprises means for selectively turning on one of the four switches for each capacitor in response to the m bits.

16. A digital-to-analog converter of claim 14, wherein each of said switch means includes first to third switch means, said first switch means selectively connecting one of the second and third switches to a corresponding one of the other ends of the capacitors, said second switch means selectively connecting the first switch means to one of the first and second switch means and said third switch means selectively connecting the first switch means to one of the third and fourth potentials; and said control means comprises first and second control means, said first control means applying each of the m bits to a pair of the second and third switch means, and said second control means generating control signals for each of the first switch means in response to a combination of the m bits.

17. A digital-to-analog converter of claim 9, further comprising a (m+1)th capacitor having a capacitance corresponding to the least significant bit of the m bits, and having an end connected to said analog voltage output line, wherein said second means further comprises means for providing the other end of the (m+1)th capacitor with the third and first potential when all of the m bits are equal to the second value and not equal thereto, respectively.

18. An analog-to-digital converter for generating a digital signal comprised of m upper bits, and n lower bits in response to an input analog voltage, comprising:
m capacitors having binary-weighted capacitance ratios and whose ends on one side are connected to a common line;
comparator means for comparing a voltage of the common line with a predetermined voltage;
a signal input means for charging the other ends of the respective capacitors with the input analog voltage;
first means connected to first and second potentials for providing selectively plural pairs of third and fourth potentials, said third potentials ranging between the first and second potential, and a sum of each pair of third and fourth potentials being equal to the second potential;
second means for connecting each of the other ends of the respective capacitors with one of said first and second potentials and the selected third and fourth potentials;
third means for controlling said second means so that said first and second potentials are provided to successively different ones of the other ends of said capacitors in order to obtain the m bits from the successive outputs of the comparator means, and for controlling said second means so that the selected third potential is provided to a first capacitor corresponding to a lowest bit among bits having a first binary value within the m bits, and the selected fourth potential is provided to second capacitors corresponding to lower bits than the first capacitor and having a second binary value within the m bits; and
fourth means for controlling said first means so that successively different pairs are selected in order to obtain the n bits from the successive outputs of the comparator means.

19. An analog-to-digital converter of claim 18, wherein said third and fourth potentials of each pair are divided voltages between the first and second potentials respectively by $i/2^n$ and by $(2^n - i/2^n)$ where i is a decimal number corresponding to different values of the n bits.

20. An analog-to-digital converter of claim 19, wherein said first means comprises
a resistor string which is connected to the first and second potentials at two ends thereof and which divides the terminal voltage across the two ends by $2^n$; and
divided-voltage deriving means connected to said resistor string to derive selectively the third and fourth potentials in response to the successive outputs of the comparator means for the n bits.

21. An analog-to-digital converter of claim 20, wherein said divided voltage deriving means comprises means for deriving an intermediate voltage between the first and second potentials; means for selecting the third potential belonging to one of the pairs from the divided voltages across the register string in response to the successive outputs of the comparator means for the n bits; and means for generating the fourth potential in response to the intermediate voltage and the selected third potential.

22. An analog-to-digital converter of claim 20, wherein said divided voltage deriving means comprises means for selecting the third potential belonging to one of the pairs from the divided voltages across the resistor string in response to the successive outputs of the comparator means for the n bits, and means for selecting the fourth potential belonging to the same pair as the one pair from the divided voltages across the resistance string in response to the successive outputs for the n bits.

23. An analog-to-digital converter of claim 18, wherein said second means comprises
a plurality of switch means respectively interposed between the other ends of the respective capacitors and the first to second potentials; and said
third means comprises control means for controlling said plurality of switch means in response to the successive outputs for the m digits.

24. An analog-to-digital converter of claim 23, wherein each of said switch means comprises four switches each interposed between one of the other ends of the capacitors and one of the first to fourth potentials, and said control means comprises means for selectively turning on one of the four switches for each capacitor in response to the successive outputs for the m bits.

25. An analog-to-digital converter of claim 23, wherein each of said switch means includes first to third switch means, said first switch means selectively connecting one of the second and third switches to a corresponding one of the other ends of the capacitors, said second switch means selectively connecting the first switch means to one of the first and second switch means, and said third switch means selectively connecting the first switch means to one of the third and fourth potentials; and said control means comprises first and second control means, said first control means applying each of the obtained m bits to a pair of the second and third switch means, and said second control means generating control signals for each of the first switch means in response to a combination of the obtained m bits.

26. An analog-to-digital converter of claim 18, further comprising a $(m+1)$th capacitor having a capacitance corresponding to the least significant bit of the m bits, and having an end connected to said analog voltage output line, wherein said second means further comprises means for providing the other end of the $(m+1)$th capacitor with the third and first potential when all of the m bits are equal to the second value and not equal thereto, respectively.

* * * * *